United States Patent
Shindo et al.

(10) Patent No.: US 11,862,935 B2
(45) Date of Patent: Jan. 2, 2024

(54) TUNABLE DBR SEMICONDUCTOR LASER (71) Applicant: Nippon Telegraph and Telephone Corporation, Tokyo (JP)

(72) Inventors: Takahiko Shindo, Musashino (JP); Naoki Fujiwara, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 84 days.

(21) Appl. No.: 17/610,519

(22) PCT Filed: May 30, 2019

(86) PCT No.: PCT/JP2019/021618
§ 371 (c)(1),
(2) Date: Nov. 11, 2021

(87) PCT Pub. No.: WO2020/240794
PCT Pub. Date: Dec. 3, 2020

(65) Prior Publication Data
US 2022/0216674 A1    Jul. 7, 2022

(51) Int. Cl.
*H01S 5/125* (2006.01)
*H01S 5/026* (2006.01)
*H01S 5/12* (2021.01)

(52) U.S. Cl.
CPC .............. *H01S 5/125* (2013.01); *H01S 5/026* (2013.01); *H01S 5/0265* (2013.01); *H01S 5/1218* (2013.01)

(58) Field of Classification Search
CPC ........ H01S 5/125; H01S 5/026; H01S 5/1218; H01S 5/2009; H01S 5/34306; H01S 5/06256; H01S 5/50; H01S 2302/00
See application file for complete search history.

(56) References Cited

U.S. PATENT DOCUMENTS 5,642,371 A * 6/1997 Tohyama ............... B82Y 20/00
372/50.1
6,566,688 B1 * 5/2003 Zhang ................... H01S 5/3434
257/85

(Continued)

FOREIGN PATENT DOCUMENTS

JP    H08-264892 A    10/1996
JP    2003-324237 A    11/2003

(Continued)

OTHER PUBLICATIONS

S.R. Johnson, P. Dowd, W. Braun, U. Koelle, C.M. Ryu, M. Beaudoin, C.- Z. Guo and Y.-H. Zhang, Long wavelength pseudomorphic InGaPAsSb type-I and type-II active layers grown on GaAs,2000, Journal of Vacuum Science & Technology B, 18,1545 (Year: 2000).*

(Continued)

*Primary Examiner* — Tod T Van Roy
*Assistant Examiner* — Maeve Elizabeth O'Brien
(74) *Attorney, Agent, or Firm* — Workman Nydegger (57) ABSTRACT

A 1.3 µm-band wavelength-tunable DBR laser in which a wavelength-tunable amount is extended is disclosed. The wavelength-tunable DBR laser according to an embodiment of the present invention is a wavelength-tunable DBR laser in which an active region having an optical gain and a DBR region including a diffraction grating are integrated monolithically and an oscillation wavelength is changed by injecting a current into the DBR region. At a boundary between a p-side clad layer and a core layer in the DBR region, an electron barrier layer being p-type doped and having a bandgap greater than in the p-side clad layer is further included. At a boundary between an n-side clad layer and the core layer in the DBR region, a hole barrier layer being (Continued)

n-type doped and having a bandgap greater than in the n-side clad layer is further included.

12 Claims, 10 Drawing Sheets

(56) References Cited

U.S. PATENT DOCUMENTS

| | | | | |
|---|---|---|---|---|
| 6,785,313 | B2* | 8/2004 | Kamath | H01S 5/06256 372/96 |
| 6,806,114 | B1* | 10/2004 | Lo | H01S 5/18361 438/36 |
| 8,143,614 | B2* | 3/2012 | Samal | B82Y 20/00 257/E33.025 |
| 2004/0080814 | A1 | 4/2004 | Ohki et al. | |
| 2010/0040103 | A1 | 2/2010 | Kishino et al. | |
| 2013/0308959 | A1* | 11/2013 | Matsui | H01S 5/06256 372/45.01 |
| 2017/0346256 | A1* | 11/2017 | Fuchida | H01S 5/34313 |

FOREIGN PATENT DOCUMENTS

| | | |
|---|---|---|
| JP | 2008-016618 A | 1/2008 |
| JP | 2010-045165 A | 2/2010 |
| JP | 2011-159752 A | 8/2011 |
| JP | 2012-004279 A | 1/2012 |
| JP | 2017-028231 A | 2/2017 |
| WO | WO-2018205580 A1 * 11/2018 | ............. H01S 3/081 |

OTHER PUBLICATIONS

Nobuhiko Ozaki et al, Emission wavelength control of InAs/GaAS quantum dots using an As2 source for near-infrared broadband light source applications, 2021 Appl. Phys. Express 14 055501 (Year: 2021).*

Y. Tohmori, et. al, *Wavelength Tuning of GaInAsP/InP Integrated Laser with Butt-jointed Built-in Distributed Brag Reflector*, Electron. Lett., vol. 19, pp. 656-658, 1983.

Y. Tohmori, et. al, *Broad-Range Wavelength-Tunable Superstructure Grating (SSG) DBR Lasers*, IEEE Journal of Quantum Electronics, vol. 29, No. 6, Jun. 1993.

R. J. Nicholas, et. al, *Cyclotron Resonance and the Magnetophonon Effect in $Ga_xIn_{1-x}As_yP_{1-y}$*, Appl. Phys. Lett., vol. 37, No. 2, pp. 178-180, 1980.

\* cited by examiner

Fig. 1

(PRIOR ART)

(PRIOR ART)

TUNABLE DBR SEMICONDUCTOR LASER

TECHNICAL FIELD

The present invention relates to a wavelength-tunable distributed Bragg reflector (DBR) semiconductor laser.

BACKGROUND ART

In optical communication, a 1.55 µm-band wavelength, where a propagation loss of an optical fiber is minimized, and a 1.3 µm-band wavelength, where dispersion of an optical fiber is zero, are widely used. A semiconductor laser serving as a light source of such wavelengths has been studied and developed as a fundamental technology for optical communication. Further, to support a data communication amount which has recently increased exponentially, the importance of a wavelength division multiplexing (WDM) scheme for enabling broadband transmission is increasing. The WDM is a scheme of multiplexing signals on light with different wavelengths in the same fiber to transmit the signals. A wavelength-tunable laser with high performance is required in a light source and a wavelength conversion unit. Examples of light sources capable of varying a wavelength include a wavelength-tunable DBR laser that uses a carrier plasma effect in which a wavelength can be varied at a high speed, in addition to a distributed feedback (DFB) laser that changes an oscillation wavelength by adjusting a temperature of an element and a broadband wavelength-selective DBR laser in which different DFB lasers with a plurality of oscillation wavelengths are arrayed and integrated on the same substrate.

In the medical field also, application of lasers is expected. A high-output semiconductor laser used for an incision knife or coagulation of a bleeding part, and a wavelength-tunable semiconductor laser as a light source of a non-invasive biological monitoring device used for optical coherence tomography (OCT) are expected.

In a 1.3 µm-band wavelength-tunable DBR laser, the change amount of a refractive index and the wavelength-tunable amount are lower than those in a 1.5 µm-band wavelength-tunable DBR laser. It is preferable to use a 1.3 µm-band wavelength-tunable DBR laser in which a wavelength-tunable amount is extended.

CITATION LIST

Non Patent Literature

Non Patent Literature 1: Y. Tohmori, et. al, "Wavelength Tuning of GaInAsP/InP Integrated Laser with Butt-jointed Built-in Distributed Brag Reflector," Electron. Lett., vol. 19, pp. 656-658, 1983

Non Patent Literature 2: Y. Tohmori, et. al, "Broad-Range Wavelength-Tunable Superstructure Grating (SSG) DBR Lasers," IEEE JOURNAL OF QUANTUM ELECTRONICS, VOL. 29, NO. 6, JUNE 1993

Non Patent Literature 3: R. J. Nicholas, et. al, "Cyclotron Resonance and the Magnetophonon Effect in GaxIn1-xAsyP1-y," Appl. Phys. Lett., Vol. 37, No. 2, pp. 178-180, 1980

SUMMARY OF THE INVENTION

The wavelength-tunable DBR laser according to an embodiment of the present invention is a wavelength-tunable DBR laser in which an active region having an optical gain and a DBR region including a diffraction grating are integrated monolithically and an oscillation wavelength is changed by injecting a current into the DBR region. The wavelength-tunable DBR laser further includes a p-type-doped electron barrier layer with a larger bandgap than a p-side clad layer at the boundary between the p-side clad layer and a core layer in the DBR region. The wavelength-tunable DBR laser further includes a n-type-doped hole barrier layer with a larger bandgap than a n-side clad layer at the boundary between the n-side clad layer and a core layer in the DBR region.

According to an embodiment of the present invention, it is possible to provide a 1.3 µm-band wavelength-tunable DBR laser in which a wavelength-tunable amount is extended.

BRIEF DESCRIPTION OF DRAWINGS

FIG. 8(a) is a diagram schematically illustrating a reflection spectrum of a rear DBR region, FIG. 8(b) is a diagram schematically illustrating a reflection spectrum of a front DBR region 40a, and FIG. 8(c) is a diagram schematically illustrating a combined reflectance spectrum obtained by multiplying the reflection spectrum of the front DBR region by the reflection spectrum of the rear DBR region.

DESCRIPTION OF EMBODIMENTS

Hereinafter, embodiments of the present invention will be described in detail with reference to the drawings. The same or similar reference numerals denote the same or similar elements and therefore repeated description thereof will be omitted in some cases. In the following description, specific numerical values or material names will be exemplified, but the present invention is not limited thereto. It is obvious that different numerical values or materials can be used.

Operation Principle of Wavelength-Tunable DBR Laser

Figure 1:
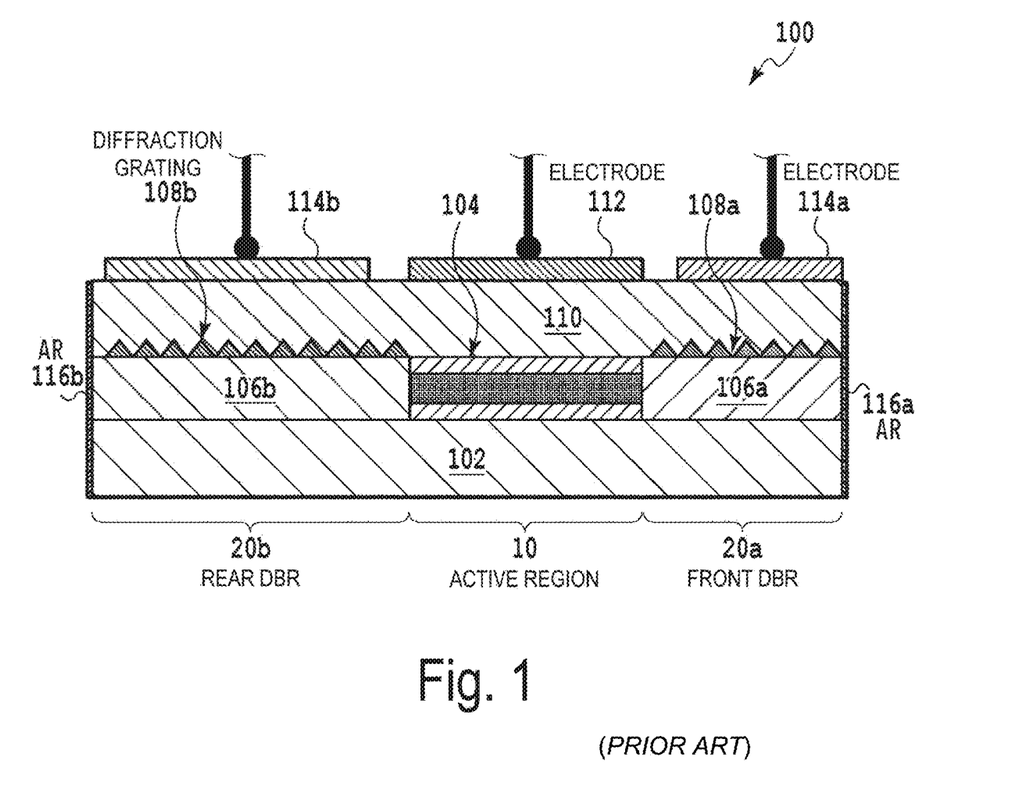
FIG. 1 is a schematic view illustrating a cross-sectional structure of a general DBR laser.

An operation principle of a wavelength-tunable DBR laser will be described. FIG. 1 is a schematic view illustrating a cross-sectional structure of a general DBR laser 100. The DBR laser 100 includes an active region 10 that obtains an optical gain by injecting a current and DBR regions 20a and 20b provided at both ends of the active region 10 in an optical axis direction. The active region 10 includes, on a substrate 102, an active layer 104 that includes vertical confinement layers, a clad 110, and an electrode 112. The front DBR region 20a includes, on the substrate 102, a DBR core layer 106a, a diffraction grating 108a, the clad 110, and an electrode 114a. The rear DBR region 20b includes, on the substrate 102, a DBR core layer 106b, a diffraction grating 108b, the clad 110, and an electrode 114b. FIG. 1 illustrates anti-reflection coatings (AR coats) 116a and 116b provided on end surfaces of the DBR laser 100.

Figure 2:
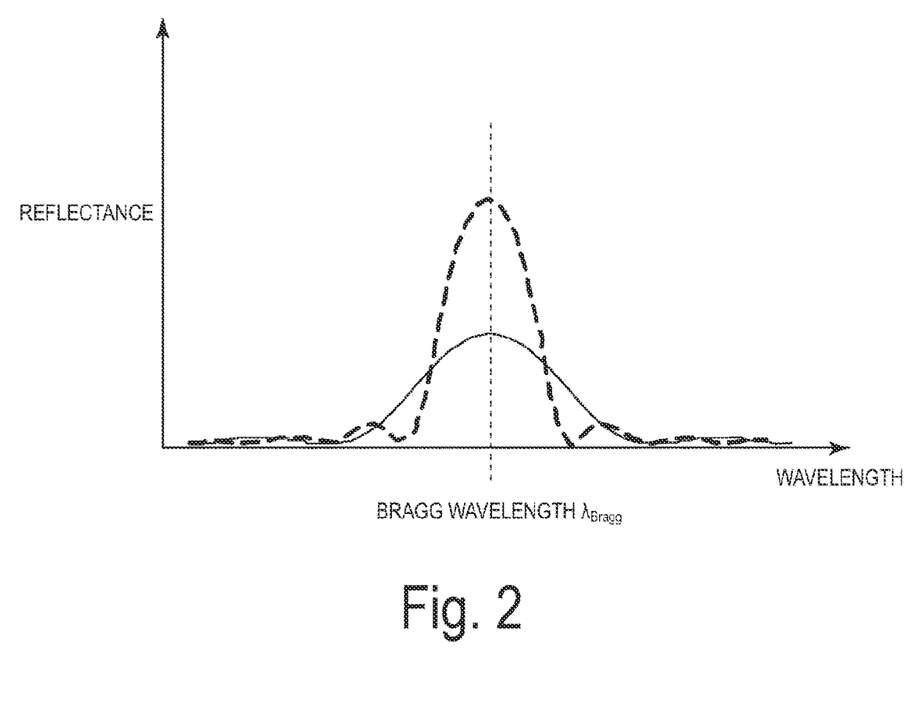
FIG. 2 is a diagram illustrating a reflection spectrum of a front DBR region and a rear DBR region in a DBR laser having the configuration illustrated in FIG. 1.

FIG. 2 is a diagram illustrating a reflection spectrum of the front DBR region 20a and the rear DBR region 20b in the DBR laser 100 that has the configuration illustrated in FIG. 1. A solid line indicates a reflection spectrum of the front DBR region 20a and a broken line indicates a reflection spectrum of the rear DBR region 20b. As shown in the spectrum of FIG. 2, a DBR serves as a mirror that selectively reflects a specific wavelength centering on a Bragg wavelength $\lambda_{Bragg}$ determined in accordance with a diffraction grating period. Because the Bragg wavelength is determined in accordance with the diffraction grating period and the front DBR region 20a and the rear DBR region 20b normally have the same diffraction grating period, Bragg wavelengths are the same. Accordingly, only wavelengths in both front and rear DBR reflection bands are selectively confined in a resonator, and an amplification effect is obtained in the active region 10 to oscillate. When the wavelength confined in the resonator is sufficiently narrow due to the front DBR region 20a and the rear DBR region 20b, oscillation is performed in a single mode. By adjusting reflectance of at least one of the front DBR region 20a and the rear DBR region 20b, it is possible to adjust an optical output from the end surface of the front DBR region 20a and the end surface of the rear DBR region 20b. That is, as illustrated in FIG. 2, by realizing a design in which the reflectance (indicated by the solid line) of the front DBR region 20a is less than the reflectance (indicated by the broken line) of the rear DBR region 20b, it is possible to inhibit an optical output from the end surface of the rear DBR region 20b and increase an optical output from the end surface of the front DBR region 20a. The structures of the diffraction grating of the front DBR region 20a and the rear DBR region 20b are generally the same, but the reflectance of the DBR region can be adjusted in accordance with the length of the DBR region.

A Bragg wavelength of the DBR region is expressed by $\lambda_{Bragg}=2n_{eq}\Lambda$. Here, $\Lambda$ indicates a diffraction grating period and $n_{eq}$ indicates an equivalent refractive index. An oscillation wavelength of a DBR laser can be changed by changing the equivalent refractive index $n_{eq}$ of the DBR region in a certain method. To change the oscillation wavelength while maintaining the oscillation of the DBR laser, the oscillation wavelength is adjusted by changing the Bragg wavelengths of both regions simultaneously while keeping the Bragg wavelengths of the front DBR region 20a and the rear DBR region 20b matched. In general, as a modulation scheme for a refractive index, a method of controlling a temperature or a method of using a carrier plasma effect generated by injecting a current is used.

As a wavelength-tunable laser using the carrier plasma effect, a DBR laser with a wavelength of 1.5 μm in which an INGaAsP/InP-based material is used has been widely reported so far (for example, see Non Patent Literature 1). Further, a wavelength-tunable DBR laser in which a wavelength-tunable width is broadened considerably by adopting a special diffraction grating structure such as a sampled grating (SG) or a super structure grating (SSG) to a DBR region has been reported (for example, see Non Patent Literature 2).

Wavelength Change Amount by Carrier Plasma Effect

A general wavelength-tunable DBR laser modulates an oscillation wavelength by decreasing a refractive index by a carrier plasma effect when a carrier density is increased by injecting a current into a DBR region, as described above. The wavelength change amount by the carrier plasma effect is expressed by the following expression.

Math. 1

$$\Delta n = \frac{e^2 \lambda^2}{8\pi^2 c^2 \varepsilon_0 n} \left( \frac{\Delta N}{m_e} + \frac{\Delta P}{m_h} \right) \quad \text{(Expression 1)}$$

Here, n indicates a core refractive index, e indicates an elementary charge, $\varepsilon_0$ indicates vacuum permittivity, c indicates the speed of light, $\Delta N$ and $\Delta P$ indicate densities of electrons and holes, respectively, and $m_e$ and $m_h$ indicate effective masses of electrons and holes, respectively. As apparent from the above expression, by injecting a current and changing the densities of electrons and holes, the refractive indexes can be changed by the carrier plasma effect. Here, in consideration of the effective mass of holes that is about 10 times the effective mass of electrons, it is important, in a change amount of a refractive index, to change the density of electrons in a core layer.

In a DBR laser with a 1.55 μm band, an InGaAsP-based material grating-matched with an InP substrate is used for the core layer of the DBR region. When a 1.3 μm band-wavelength DBR laser is manufactured using this material, an effective mass of a semiconductor material of which the DBR region is formed can be used as an important parameter for determining a change amount of a refractive index.

Here, problems with a 1.3 μm-band wavelength-tunable DBR laser and causes of the problems will be described. A 1.3 μm-band wavelength-tunable DBR laser formed of an InGaAsP/InP-based material has problems that a change in a refractive index is less than that of a 1.55 μm-band wavelength-tunable DBR laser, and a sufficient wavelength-tunable amount cannot be obtained. As is apparent from Expression 1 of the carrier plasma effect described above, the change amount of the refractive index is reduced as the oscillation wavelength becomes shorter. Simply, when an oscillation wavelength becomes 1.3 μm from 1.55 μm, a change amount of the refractive index may decrease to about $(1.3/1.55)^2=0.7$ times. One more cause is a reduction in a refractive index change resulting from an increase in the effective mass of InGaAsP in the core layer. For the core layer of the DBR laser, a material that has a small absorption loss with respect to oscillated light is used. That is, a composition is selected so that a bandgap wavelength of the core layer becomes a sufficiently short wavelength with respect to the oscillated light. In the case of a general DBR laser with a 1.55 μm band, InGaAsP having a bandgap wavelength of about 1.4 μm is used for the core layer of the DBR region. In the case of a 1.3 μm-band wavelength-tunable DBR laser, it is necessary to use InGaAsP having a bandgap wavelength of about 1.1 to 1.2 μm, which is sufficiently shorter than an oscillation wavelength of 1.3 μm, for the core layer of the DBR region. Here, the problem is that the effective mass $m_e$ tends to increase with a decrease in the bandgap wavelength of InGaAsP grating-matched with InP (for example, see Non Patent Literature 3). As is apparent from the expression of the carrier plasma effect described above, the increase in the effective mass of electrons in the material of the core layer is linked with a decrease in the change amount of the refractive index. In addition to this cause, in a case of manufacturing a 1.3 μm-band wavelength-tunable DBR laser in which InGaAsP with a bandgap wavelength of about 1.1 μm (1.1 Q) is used for a core layer, only the wavelength change amount equal to or less than half in that of a 1.55 μm-band wavelength-tunable DBR laser can be obtained.

As described above, a change amount of a refractive index in a 1.3 μm-band wavelength-tunable DBR laser is less than that in a 1.55 μm-band wavelength-tunable DBR laser, and thus a sufficient wavelength-tunable amount cannot be obtained. In a general wavelength-tunable DBR laser in which InGaAsP/InP is used, even when the same carriers as those of a 1.55 μm-band wavelength-tunable DBR laser are injected, only a wavelength-tunable amount equal to or less than half can generally be obtained in a 1.3 μm-band wavelength-tunable DBR laser. Accordingly, to obtain a sufficient wavelength-tunable amount in a 1.3 μm-band wavelength-tunable DBR laser, it is effective to use a method of introducing a structure for confining many carriers in the core layer of the DBR region.

Wavelength-Tunable DBR Laser According to the Embodiment

As a carrier confinement structure according to an embodiment of the present invention, a carrier barrier layer in which a bandgap is greater than that in a clad layer is introduced in a boundary between the clad layer and the core layer of the DBR region. Further, a carrier barrier layer introduced in the boundary between a p-side clad layer and a core layer is doped in a p-type so as to have a carrier density greater than that in a p-type clad layer. Similarly, a carrier barrier layer introduced in the boundary between a n-clad layer and the core layer is doped in a n-type and designed to have a carrier density greater than that of a n-clad layer.

As described above, it is more difficult to change a wavelength in a 1.3 μm-band wavelength-tunable DBR laser than in a 1.55 μm-band wavelength-tunable DBR laser. Therefore, it is necessary to increase the density of electrons by injecting more currents. However, there is a limit to an increase in the density of electrons and holes of the core layer by injecting a current. This is due to the fact that the density of electrons and holes does not increase because the electrons and holes overflow in p-side and n-side clad layers as a current is applied.

Figure 3:
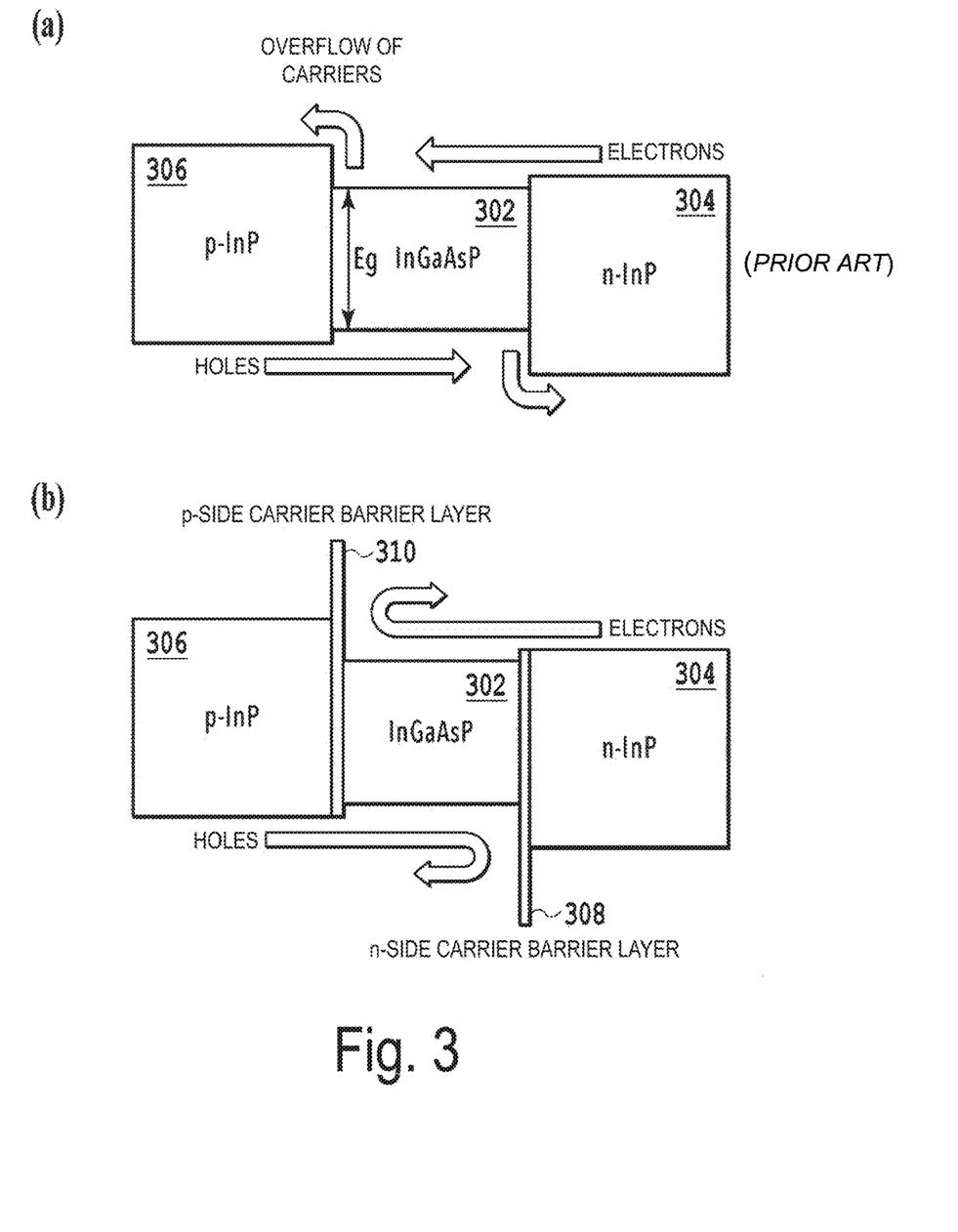
FIG. 3(a) is a diagram schematically illustrating a band structure of a DBR region of the related art.
FIG. 3(b) is a diagram illustrating a band structure of a DBR region according to an embodiment of the present invention.

FIG. 3 is a diagram schematically illustrating band structures of DBR regions. Focusing on the electrons in the band structure of a DBR region of the related art illustrated in FIG. 3(a), the band on the conduction band side is flattened as a voltage is applied and carriers are injected into the core layer. However, with application of a voltage, electrons getting over a barrier of a boundary between the core layer and a p-side InP clad and overflowing to the p side increase, and thus the density of electrons does not increase. For holes on a valence electron band side, there is a limit to an increase in the density of holes for the same reason. As illustrated in FIG. 3(b), in a band structure of a DBR region according to an embodiment of the present invention, a p-type carrier barrier layer is introduced between a core layer and a p-InP clad and an n-type carrier barrier layer is introduced between the core layer and the n-InP. The barrier layers have a composition with a larger bandgap than the clad layers and designed to have higher carrier density than the clad layers as p-type and n-type semiconductors by doping, and thus can be formed to have a high confinement effect in the core layer with respect to electrons and holes. In particular, for an InP-based material, the high effect can be obtained by using InAlAs as a material with a larger bandgap than InP. By introducing the barrier layers between the core layer and the p-InP clad and between the core layer and the n-InP, the carrier confinement effect in the core layer can be improved, and thus, a sufficient wavelength change amount can be realized in the 1.3 μm band.

The wavelength-tunable DBR laser according to the embodiment is a wavelength-tunable DBR laser having an oscillation wavelength of 1.3 μm (for example, equal to or greater than 1.27 μm and equal to or less than 1.33 μm) in which an active region having an optical gain and a DBR region including a diffraction grating are integrated monolithically and an oscillation wavelength varies when a current is injected into the DBR region. A p-type doped electron barrier layer having a bandgap greater than that of a p-side clad layer is provided at the boundary between the p-side clad layer and a core layer in the DBR region. A n-type doped hole barrier layer having a bandgap greater than that of an n-side clad layer is provided at the boundary between the n-side clad layer and the core layer in the DBR region.

The DBR core layer can be formed of, for example, InGaAsP or InGaAlAs. A bandgap wavelength of the DBR core layer is, for example, equal to or greater than 1.0 μm (1.0 Q) and equal to or less than 1.2 μm (1.2 Q). A diffraction grating of the DBR region may be a super structure grating (SSG).

Example 1

Figure 4:
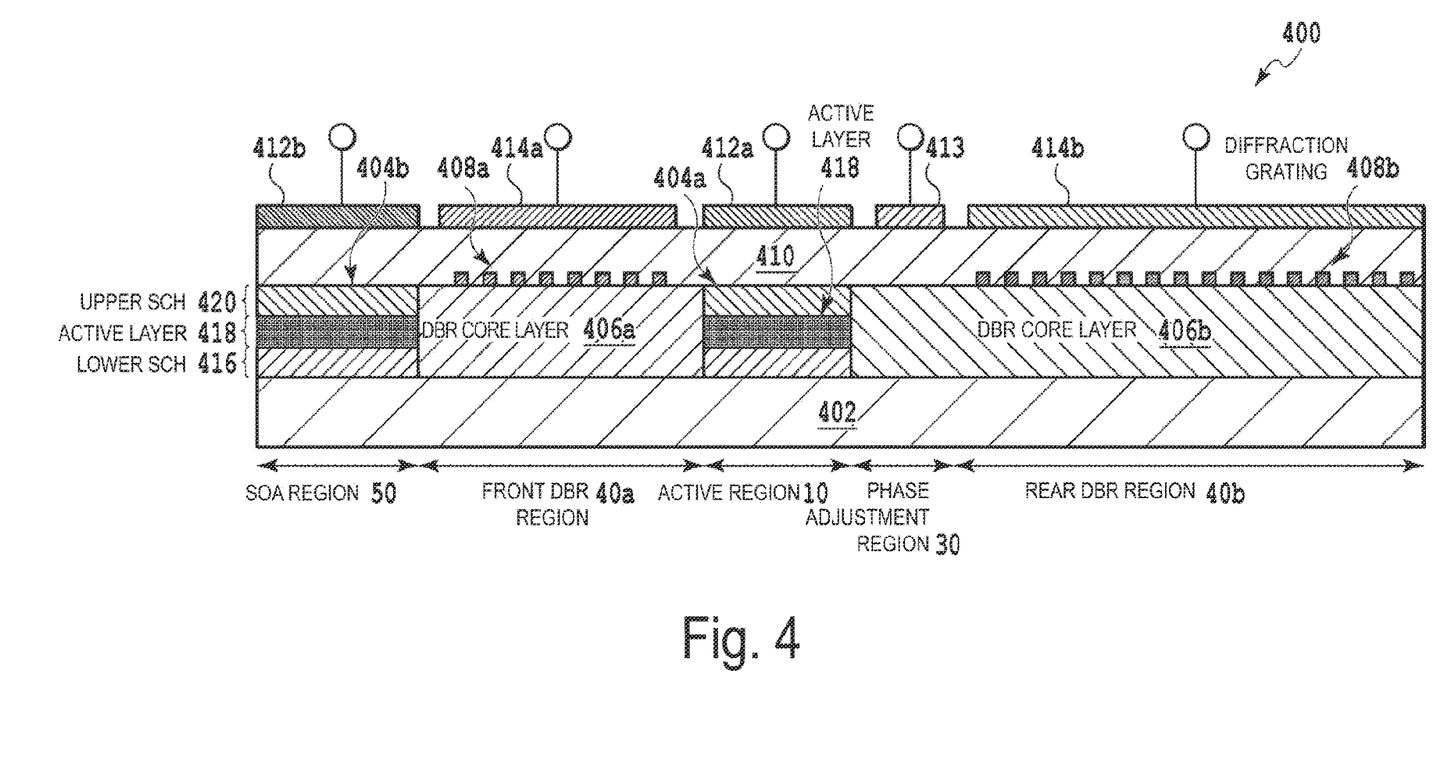
FIG. 4 is a view of a cross-section of a wavelength-tunable DBR laser according to Example 1 of the present invention.

FIG. 4 is a cross-sectional view of a wavelength-tunable DBR laser 400 according to Example 1. In the wavelength-tunable DBR laser 400, the active region 10 in which an optical gain is produced by injecting a current, the DBR region 40a and an SOA region 50 on the front side of the active region 10 in the optical axis direction, and a phase adjustment region 30 and the DBR region 40b on the rear side of the active region 10 in the optical axis direction are integrated.

The active region 10 includes, on an n-InP substrate 402, a lower separated confinement heterostructure (SCH) 416, an active layer 418, an upper SCH 420, a clad 410, and an electrode 412a. A length of the active region 10 in the optical axis direction is 250 μm.

The SOA region 50 includes, on the n-InP substrate 402 the lower SCH 416, the active layer 418, the upper SCH 420, the clad 410, and an electrode 412b as in the active region 10. A length of the SOA region 50 in the optical axis direction is 300 μm.

The front DBR region 40a includes, on the n-InP substrate 402, a DBR core layer 406a, a diffraction grating 408a, a clad 110, and an electrode 414a. A length of the front DBR region 40a in the optical axis direction is 200 μm.

The rear DBR region 40b includes, on the substrate 102, a DBR core layer 406b, a diffraction grating 408b, the clad 110, and an electrode 414b as in the front DBR region 40a. A length of the rear DBR region 40b in the optical axis direction is 500 μm.

The phase adjustment region 30 includes the DBR core layer 406b, the diffraction grating 408b, the clad 110, and the electrode 414b on the substrate 102 as in the front DBR region 40a. A length of the phase adjustment region in the optical axis direction is 100 µm.

Next, a process of manufacturing the wavelength-tunable DBR laser 400 will be described. In element manufacturing, an initial substrate is used on which a lower SCH layer 416, the active layer 418 of a multiple quantum well layer (MQW1), and an upper SCH layer 420, in which InGaAsP is used, are sequentially grown on the n-InP substrate 402. The multiple quantum well layer obtains an optical gain with respect to an oscillation wavelength of 1.3 µm band.

First, portions (404a and 404b) which become the active region 10 and the SOA region 50 of the wavelength-tunable DBR laser 400 are left, the upper SCH 420, the active layer 418, and the lower SH 416 of the other regions are electively etched to grow a semiconductor layer for the front DBR region 40a, the phase adjustment region 30, and the front DBR region 40b by butt-joint regrowth. A layer structure of the DBR regions 40a and 40b has an n-InP layer, an n-InAlAs layer, an i-InGaAsP (1.1 Q) layer, a p-InAlAs layer, and a p-InP layer from the side of the n-InP substrate 402. The p-side InAlAs layer and the n-side InAlAs layer function as barrier layers for electrons and holes. (the n-InP layer, the n-side InAlAs layer, the i-InGaAsP (1.1 Q) layer, the p-side InAlAs layer, and the p-InP layer respectively correspond to the n-InP layer 304, the n-side carrier barrier layer 308, the InGaAsP 302, the p-side carrier barrier layer 310, and the p-InP 306 in FIG. 3(b)). Further, both of the n-InAlAs layer and the i-InGaAsP layer are grating-matched with the n-InP layer. Both of the p-InAlAs layer and the i-InGaAsP layer are grating-matched with the p-InP layer. Here, for the p-side InAlAs, the effect of an electron barrier layer can be adjusted with impurity density thereof. For the n-side InAlAs, the effect of a hole barrier layer can be adjusted with impurity density thereof. In order to achieve a sufficient carrier confinement effect, the impurity density of $5×10^{17}$ cm$^{-3}$ or more is necessary. When the impurity density of the p-InAlAs layer is small, in addition to a decrease in the effect of the electron barrier in a conduction band, a hole barrier may be formed between the p-InP clad and the core layer on the valence band side. The same applies to the n-InAlAs layer. Accordingly, a sufficient impurity density is necessary in the p-InAlAs that is a p-side barrier layer and the n-InAlAs that is an n-side barrier layer. In this example, doping is performed on both the p-type InAlAs and the n-type InAlAs so that carrier density becomes $1×10^{18}$ cm$^{-3}$. Subsequently, the uniform diffraction gratings 408a and 408b operating at the oscillation wavelength of 1.3 µm band are formed on the upper surfaces of the DBR core layer 406a of the front DBR region 40a and the DBR core layer 406b of the rear DBR region 40b. Thereafter, the p-InP clad layer 410 is grown on the entire element surface by regrowth. The thickness of the p-InP clad layer 410 is designed so that an optical field is not included in the electrode region. In this example, the thickness of the p-InP clad layer 410 is 2.0 µm. Further, a mesa structure extending in the optical axis direction is formed by etching and a semi-insulating InP layer in which both sides of a mesa structure have been doped with Fe is formed by re-embedding regrowth. Subsequently, p-side electrodes 412a, 412b, 413, 414a, and 414b are formed on the upper surface of a semiconductor wafer. Thereafter, processes on a semiconductor wafer are completed by polishing the n-InP substrate 402 to 150 µm and forming electrodes (not illustrated) on the rear surface of the substrate. A waveguide structure according to this example has a buried hetero structure in which InP layers are formed on both sides of the mesa structure in the horizontal direction. A stripe width is set to 1.5 µm and an operation is performed at a single wavelength due to the diffraction gratings formed in the front DBR region 40a and the rear DBR region 40b. In the SOA region 50, the core layer structure formed on the initial substrate remains as it is. The SOA region 50 has the same layer structure as the active region 10 of the wavelength-tunable DBR laser 400. In addition, the front DBR region 40a, the rear DBR region 40b, and the phase adjustment region 30 have the same layer structure formed by the butt-joint growth, and the layer structure of these regions are different only in the presence or absence of the diffraction grating. As a result, the number of times the regions are regrown is reduced even in the structure in which multiple regions are integrated, and low cost manufacturing can be achieved.

Operation feature evaluation of the manufactured wavelength-tunable DBR laser 400 is performed. An oscillation threshold of the DBR laser is about 25 mA under the condition of 25° C. An optical output of about 5 mW is obtained by injecting a current of 90 mA into the active region 10 and a current of 100 mA into the SOA region 50 in a state (an open state) in which a current is not applied to the DBR regions of the wavelength-tunable DBR laser 400.

Figure 5:
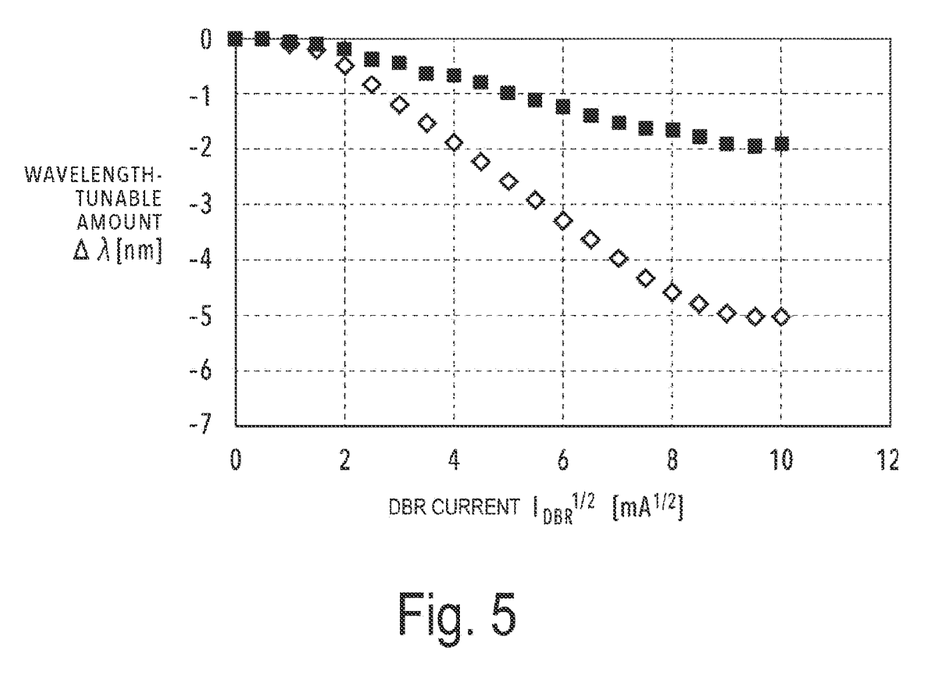
FIG. 5 is a diagram illustrating a relation between a current injection amount and a change amount of an oscillation wavelength of the front DBR region.

Subsequently, wavelength-tunable feature evaluation of the manufactured element is performed. Here, to confirm an introduction effect of the InAlAs barrier layer, the wavelength-tunable DBR laser which does not include the InAlAs barrier layer is manufactured through the same processes. Here, a wavelength-tunable DBR laser that includes an InAlAs barrier layer is referred to as an element B and a wavelength-tunable DBR laser that does not include a comparison InAlAs barrier layer is referred to as an element A. In the element A, a layer structure of the front DBR region 40a and the rear DBR region 40b includes an n-InP layer, an i-InGaAsP layer (1.1 Q), and a p-InP layer. The other element structure is the same as that of the above-described wavelength-tunable DBR laser 400. For the wavelength-tunable feature evaluation, an oscillation wavelength spectrum is measured while adjusting an injection current amount in the DBR regions. Here, a current of 90 mA is injected into the active region 10 and a current of 100 mA is injected into the SOA region 50. The current injection amounts for the front DBR region 40a and the rear DBR region 40b are adjusted to be proportional to region lengths. That is, a current Ifront injected into the front DBR region and a current Irear injected into the rear DBR region 40b are adjusted to be proportional to Ifront/Irear=200/500. The phase adjustment region 30 is adjusted in a range of 0 to 10 mA so that a side-mode suppression ratio (SMSR) becomes maximum from the oscillation spectrum. A relation between a change amount of the oscillation wavelength and the current injection amount of the evaluated front DBR region 40a is illustrated in FIG. 5. In FIG. 5, ■ indicates the element A and ◇ indicates the element B. As apparent from the wavelength-tunable feature of the element A illustrated in FIG. 5, a wavelength-tunable amount considerably decreases compared to the DBR laser of a 1.55 µm band in the DBR laser of a 1.3 µm band, and the wavelength-tunable amount is saturated as about 2 nm. The wavelength changes is saturated with the current injection is due to the effect of heat generation due to the current injection. Since the refractive index of semiconductor materials increases as the temperature rises, the heat generation cancels the change in the refractive index due to the carrier plasma effect. In contrast, a wavelength-tunable amount of the element B can be about 4.5 nm which is substantially the same as that of the general 1.55 μm-band wavelength-tunable DBR laser. From the above results, it was confirmed that introduction of the barrier layer of InAlAs in DBR laser of 1.3 μm band has a high effect on improving the wavelength-tunable feature.

Example 2

A wavelength-tunable DBR laser according to Example 2 is different from the wavelength-tunable DBR laser according to Example 1 in that InGaAlAs is adopted in the DBR core layers 406a and 406b of the DBR regions 40a and 40b instead of InGaAsP of the related art, and the other points are the same as those of the wavelength-tunable DBR laser according to Example 1.

Figure 6:
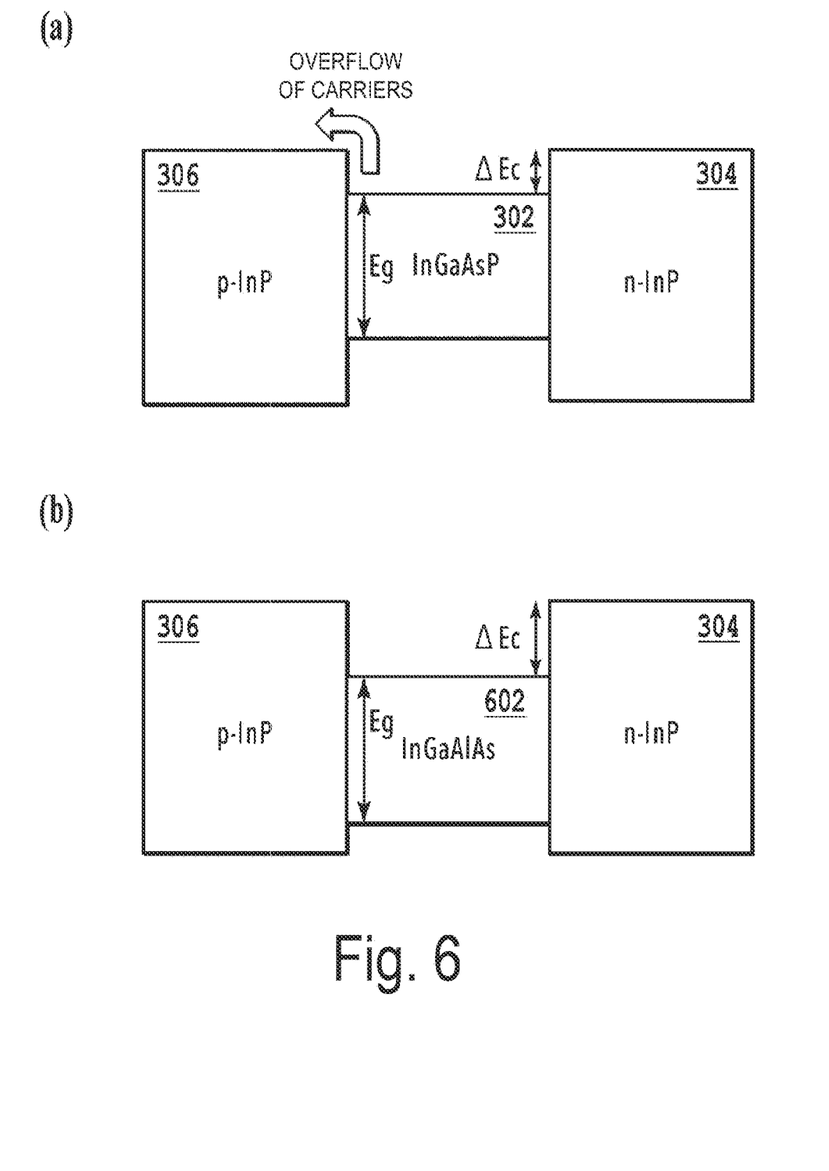
FIG. 6(a) is a diagram schematically illustrating a band structure in a case of using InGaAsP in a core layer of a DBR region.
FIG. 6(b) is a diagram schematically illustrating a band structure in a case of using InGaAlAs in the core layer of the DBR region.

FIG. 6 is a diagram illustrating a case in which InGaAsP is used for the DBR core layer and a case in which InGaAlAs is used are schematically compared. FIG. 6(a) illustrates a band structure when InGaAsP 302 is used for the DBR core layer and FIG. 6(b) illustrates a band structure when InGaAlAs 602 is used for the DBR core layer. In FIG. 6, the barrier layer is not illustrated to facilitate comparison of the boundary between the DBR core layer and the clad layer. As described above, to increase the wavelength-tunable amount by the carrier plasma effect, it is important to further increase the density of electrons than the density of holes. This is caused due to an effective mass of electrons which is about 10 times less than an effective mass of holes. When InGaAlAs is adopted in the DBR core layer, the electron confinement effect that electrons are confined in the DBR core layer can be further improved than in the InGaAsP layer. In FIG. 6, a bandgap wavelength is set to 1.1 Q in both the DBR core layers of InGaAsP and InGaAlAs. As can be seen from FIG. 6, a conduction band barrier ΔEc with InP can generally be greater for InGaAlAs than InGaAsP. That is, with regard to electrons, a barrier between the InP clad and the DBR core layer is large, and thus a structure in which it is easy to confine electrons in the DBR core layer is formed. On the other hand, with regard to holes of a valence electron band, when InGaAlAs is adopted in the DBR core layer, the barrier between the InP clad and the DBR core layer becomes small compared to the InGaAsP layer, and thus the confinement effect decreases. However, because a contribution to a change in the refractive index of holes is less than a contribution to a change in the refractive index of electrons, an influence on the change in the refractive index is not large.

Figure 7:
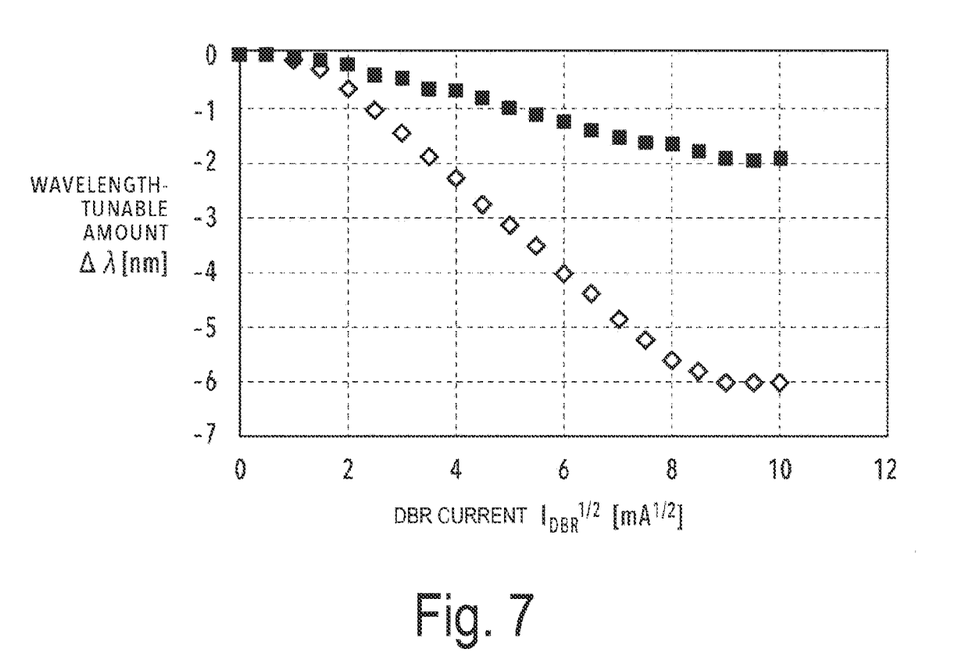
FIG. 7 is a diagram illustrating a relation between a current injection amount and a change amount of an oscillation wavelength of the front DBR region.

A layer structure, each region length, and a manufacturing process of the active region 10 in the wavelength-tunable DBR laser according to this example are the same as those of the wavelength-tunable DBR laser according to Example 1 described above. An oscillation wavelength is also 1.3 μm. Only differences are that InGaAlAs is used for DBR core layers 406a and 406b of the front DBR region 406a and the rear DBR region 406b, and the layer structure of the DBR regions 40a and 40b has an n-InP layer, an n-InAlAs layer, an i-InGaAlAs (1.1 Q) layer, a p-InAlAs layer, and a p-InP layer from the side of the n-InP substrate 402. Here, both the InAlAs and InGaAlAs layers are grating-matched with InP. As in the case of Example 1, the p-side InAlAs layer and the n-side InAlAs layer function as barrier layers for electrons and holes, respectively. Wavelength-tunable feature evaluation of the manufactured wavelength-tunable DBR laser was performed. As in the case of Example 1, in the wavelength-tunable feature evaluation, an oscillation wavelength spectrum was measured while adjusting an injection current amount for the DBR regions 40a and 40b. Here, a current of 90 mA is injected into the active region 10, and a current of 100 mA is injected into the SOA region 50s. The current injection amounts for the front DBR region 40a and the rear DBR region 40b were adjusted to be proportional to region lengths. Further, the phase adjustment region 30 was adjusted in a range of 0 to 10 mA so that an SMSR becomes maximum from the oscillation spectrum. The wavelength-tunable feature evaluated is illustrated in FIG. 7. For comparison, the wavelength-tunable feature of the wavelength-tunable DBR laser (the element A) of the related art in which the InGaAsP layer described in Example 1 is included in the DBR core layers 406a and 406b of the DBR regions 40a and 40b is also illustrated. In FIG. 7, ■ indicates the element A and ◇ indicates an element C which is the wavelength-tunable DBR laser according to this example. In the element C according to this example, the wavelength-tunable amount further increases than in the element B according to Example 1, and thus about 6 nm is obtained. A sufficient wavelength-tunable feature can be obtained as a general wavelength-tunable DBR laser. From this, the effect obtained by adopting the InGaAlAs layer in the DBR core layers 406a and 406b of the DBR regions 40a and 40b is confirmed.

Example 3

A wavelength-tunable DBR laser according to Example 3 is different from the wavelength-tunable DBR laser according to Example 2 in that an SSG is adopted in the diffraction gratings 408a and 408b of the front DBR region 40a and the rear DBR region 40b of the wavelength-tunable DBR laser 400 described with reference to FIG. 4. The others are the same as those of the wavelength-tunable DBR laser according to Example 2.

In a general DBR laser, a uniform diffraction grating is adopted in a DBR region and one reflection band is used for a variation in a wavelength. In contrast, a plurality of reflection bands can also be added to the DBR region by a special diffraction grating structure called in a super structure grating in an SSG-DBR laser. Thus, it is possible to realize a broader wavelength-tunable width.

Figure 8:
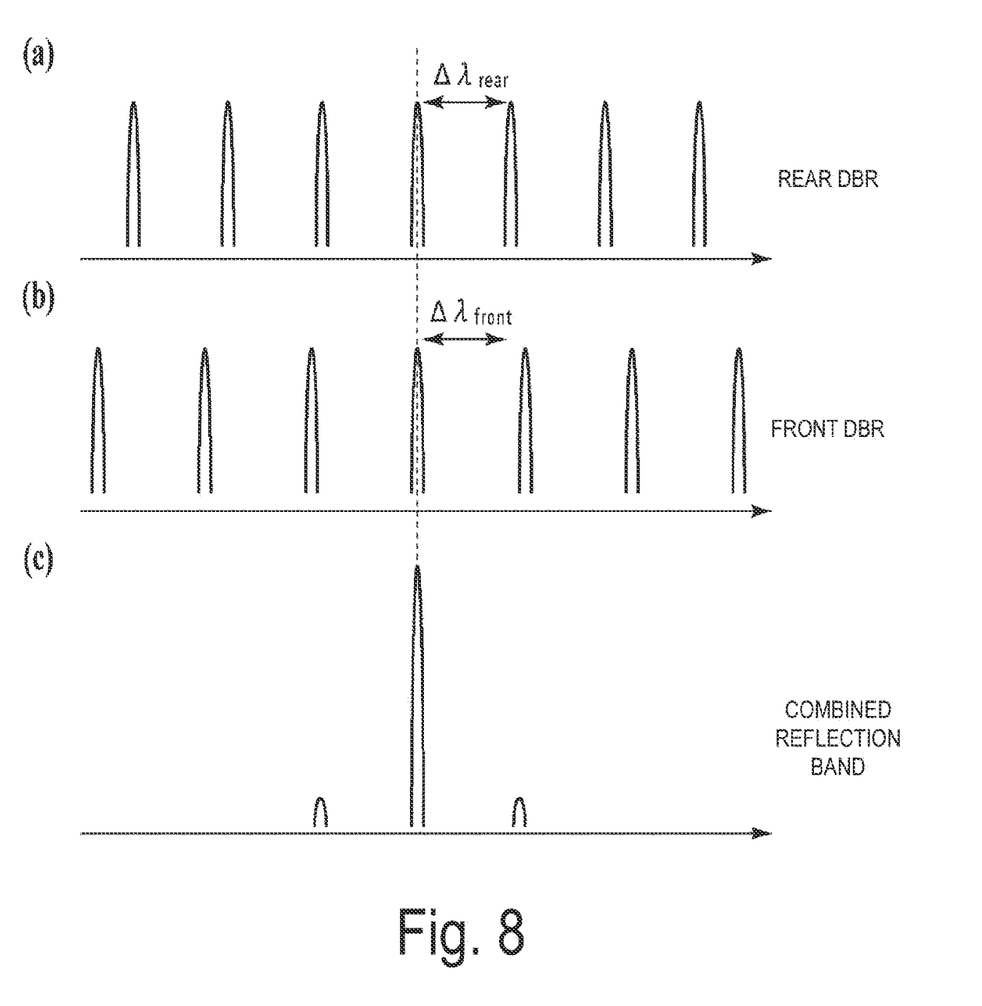
FIG. 8 is a schematic diagram illustrating reflection bands of DBR regions in an SSG-DBR laser, where

FIG. 8 is a schematic diagram illustrating a reflection band of the DBR region in an SSG-DBR laser. FIG. 8(a) schematically illustrates a reflection spectrum of the rear DBR region 40b. FIG. 8(b) schematically illustrates a reflection spectrum of the front DBR region 40a. FIG. 8(c) schematically illustrates a combined reflectance spectrum obtained by multiplying the reflection spectrum of the front DBR region 40a by the reflection spectrum of the rear DBR region 40b. As illustrated in FIG. 8, the diffraction grating 408a which is the SSG of the front DBR region 40a and the diffraction grating 408b which is the SSG of the rear DBR region 40b have reflection spectra in which a plurality of reflection peaks are arranged at an equal interval. The reflection spectra of both the diffraction gratings 408a and 408b have seven reflection peaks. In FIG. 8, reflection peak intervals of the reflection spectra of the diffraction gratings 408a and 408b are indicated by $\Delta\lambda_{front}$ and $\Delta\lambda_{rear}$, respectively. Here, $\Delta\lambda_{front}$ is designed to be slightly greater than $\Delta\lambda_{rear}$. Due to a difference between the reflection peak intervals, a broad wavelength-tunable width can be realized with a single mode operation remaining in the SSG-DBR laser. This is because $\Delta\lambda_{front}$ and $\Delta\lambda_{rear}$ are slightly different, the reflection peaks of the reflection spectrum of the front DBR region and the reflection peaks of the reflection spectrum of the rear DBR region are completely matched at only one location, and therefore a combined reflection spectrum has one reflection peak. In the example illustrated in FIG. 8, the fourth reflection peaks from the short wavelengths are matched among the reflection peaks of the reflection spectrum of the front DBR region and the reflection peaks of the reflection spectrum of the rear DBR region. Accordingly, in the combined reflection spectrum illustrated in FIG. 8(c), there is only one reflection peak at which the reflection peak of the reflection spectrum of the front DBR region and the reflection peak of the reflection spectrum of the rear DBR region are matched.

Figure 9:
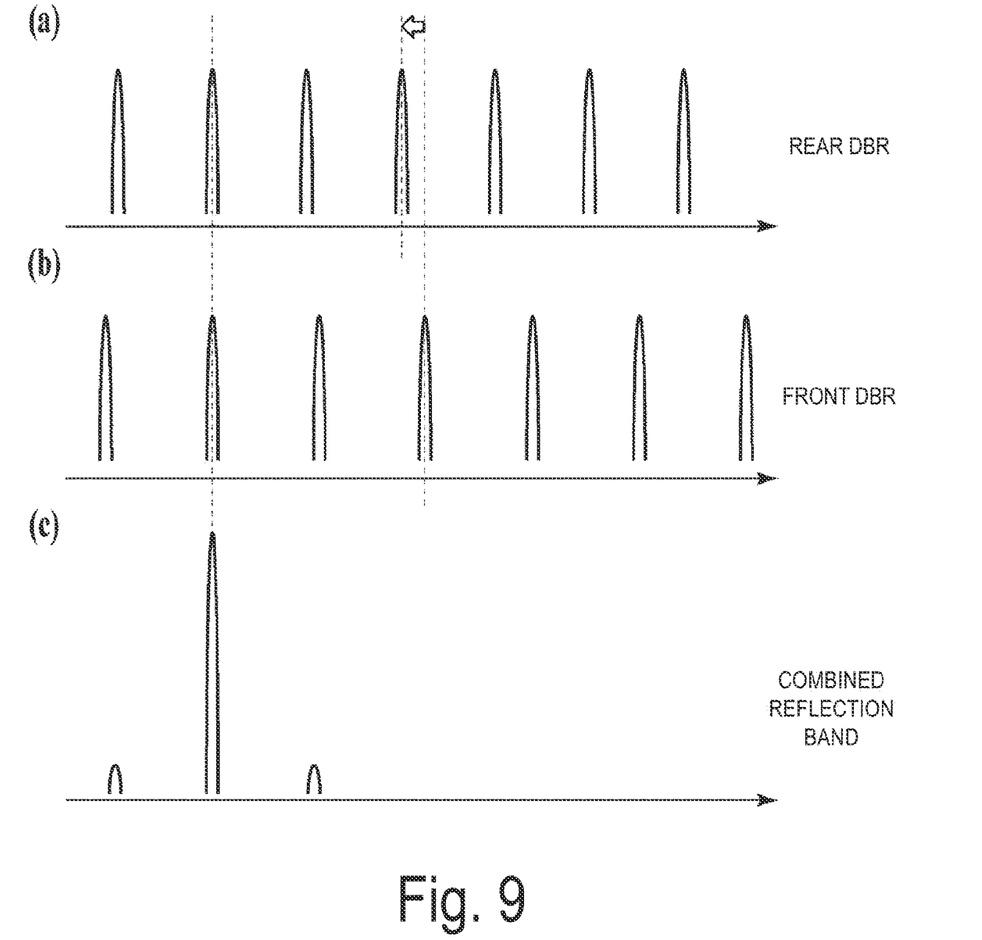
FIG. 9 is a diagram illustrating an example of a wavelength varying operation of the SSG-DBR laser.

FIG. 9 is a schematic diagram when, as an example of a wavelength-tunable operation of the SSG-DBR laser, a current is injected into the rear DBR region 40b of the front DBR region 40a and the rear DBR region 40b to modulate a refractive index by the carrier plasma effect and shift the reflection spectrum of the rear DBR region 40b to the short wavelength side. In this case, the reflection spectra of the front DBR region 40a and the rear DBR region 40b are matched at the second reflection peak from the short wavelength sides, and the peak of the combined reflection spectrum can also be shifted considerably to the short wavelength side. Even in this case, the reflection peaks of the front DBR region 40a and the rear DBR region 40b are matched at only one location, and thus the operation can be performed in the single mode. In this way, by adjusting current amounts injected into the front DBR region 40a and the rear DBR region 40b and individually adjusting the reflection spectra, it is possible to use all the plurality of reflection peaks and realize a broad wavelength-tunable width.

Here, a relation between a wavelength shift amount occurring by the carrier plasma effect and the reflection peak interval of the SSG will be described. As the above-described wavelength varying operation of the SSG, the oscillation wavelength can be considerably changed by selectively oscillating a plurality of certain reflection peaks by adjusting injection current amounts of the front DBR region 40a and the rear DBR region 40b. However, in order to oscillate the reflection peaks at wavelengths between the reflection peaks, as in a general DBR laser that includes a uniform diffraction grating, it is necessary to simultaneously inject a current into the front DBR region 40a and the rear DBR region 40b and simultaneously shift the reflection peaks. That is, in order to realize an SSG-DBR capable of oscillating the reflection peaks at all the wavelengths between the reflection peaks, it is necessary to cause the wavelength-tunable width obtained by the carrier plasma effect to be large rather than the fact that one of $\Delta\lambda_{front}$ and $\Delta\lambda_{rear}$ is larger. In other words, when the SSG-DBR laser is designed, it is necessary to design $\Delta\lambda_{front}$ and $\Delta\lambda_{rear}$ which are both less than the wavelength-tunable width obtained by the carrier plasma effect. Otherwise, a wavelength band that cannot be oscillated may occur between the reflection peak.

Here, a structure of the wavelength-tunable DBR laser according to Example 3 will be described. A manufacturing process and the structure of the wavelength-tunable DBR laser are the same as those of the wavelength-tunable DBR laser according to Example 2 except that an SSG is adopted as the diffraction gratings 408a and 408b of the front DBR region 40a and the rear DBR region 40b. That is, the rear DBR region 40b, the phase adjustment region 30, the active region 10, the front DBR region, and the SOA region are integrated in this order in the optical axis direction. A layer structure of the DBR core layers 406a and 406b of the front DBR region 40a and the rear DBR region 40b has an n-InP layer, an n-InAlAs layer, an i-InGaAsP (1.1 Q) layer, a p-InAlAs layer, and a p-InP layer in this order from the side of the n-InP substrate 402. The p-side InAlAs layer and the n-side InAlAs layer function as barrier layers. As described in Example 2, a wavelength-tunable width is about 6 nm when this DBR structure is used. Accordingly, it is necessary to design the front and rear SSG-DBR regions of a trial production element in this example so that the reflection peak interval is equal to or less than 6 nm in both the regions. Here, the reflection peak interval $\Delta\lambda_{front}$ of the front DBR region 40a was designed to 5.2 nm and the reflection peak interval $\Delta\lambda_{rear}$ of the rear DBR region 40b was designed to 5.0 nm.

Figure 10:
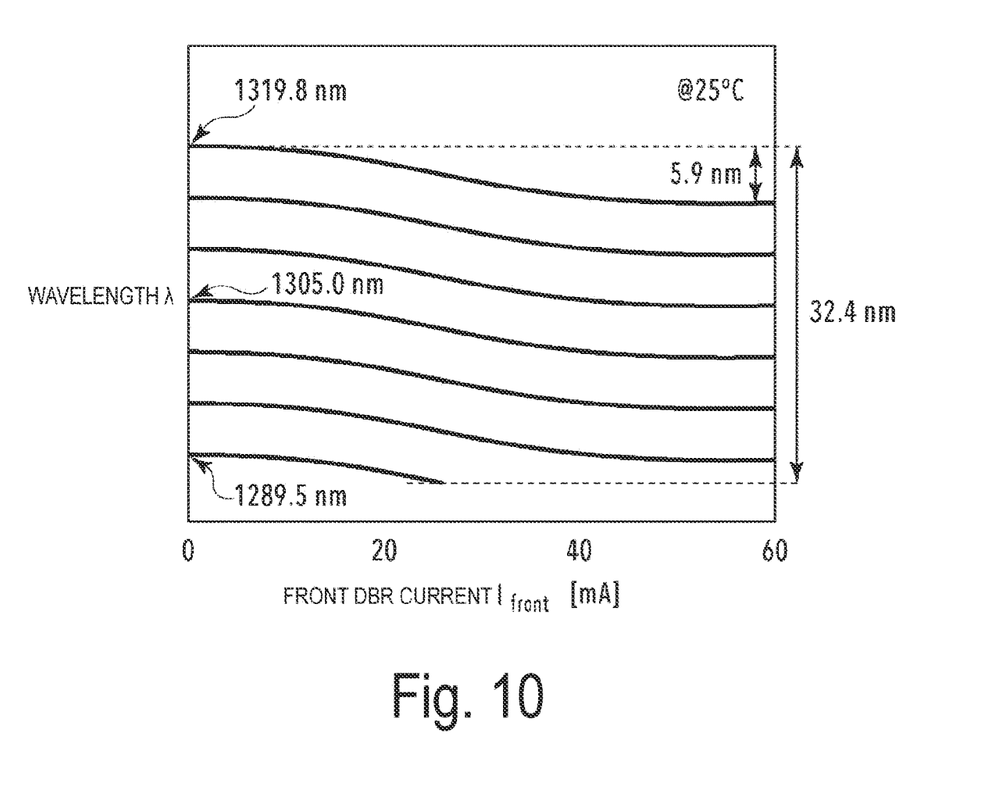
FIG. 10 is a diagram illustrating a peak wavelength of an oscillation spectrum of the wavelength-tunable DBR laser (SSG-DBR laser).

Wavelength-tunable feature evaluation of the trial production wavelength-tunable DBR laser (the SSG-DBR laser) is performed. Here, currents injected into the active region 10 and the SOA region 50 are set to 90 mA and 100 mA. Different current sources is used for the front DBR region 40a and the rear DBR region 40b to measure oscillation spectra when the currents are changed from 0 to 60 mA individually at intervals of 1 mA. At this time, the phase adjustment region 30 is adjusted in the range of 0 to 10 mA under each condition so that that the SMSR is the smallest. A result obtained by plotting all the peak wavelengths of the measured oscillation spectra is illustrated in FIG. 10. Each curve in FIG. 10 shows a reflection peak of the SSG-DBR region. In this element, the SSG is designed so that both the front DBR region 40a and the rear DBR region 40b have seven reflection peaks. From the measurement result, it is possible to confirm that seven reflection peaks cannot be obtained. It can be confirmed that each curve is shifted to the short-wavelength side with the injection of the current. A wavelength-tunable width which one reflection peak can take indicates a change width of the refractive index by the carrier plasma effect. Because the same element structure as that of Example 2 is adopted to this element except for the diffraction grating, a wavelength-tunable width of about 6 nm which is the same as that of the element of Example 2 can be obtained.

Except for the diffraction grating structure, in the wavelength-tunable DBR laser according to this example, the layer structure of each region, the length of each region, and the manufacturing process are all the same as those of the manufacturing device according to Example 2.

The invention claimed is:

1. A wavelength-tunable DBR laser in which an active region having an optical gain and a DBR region including a diffraction grating are integrated monolithically and an oscillation wavelength is changed by injecting a current into the DBR region, the wavelength-tunable DBR laser comprising:
   at a boundary between a p-side clad layer and a core layer in the DBR region, an electron barrier layer being p-type doped and having a bandgap greater than in the p-side clad layer; and
   at a boundary between an n-side clad layer and the core layer in the DBR region, a hole barrier layer being n-type doped and having a bandgap greater than in the n-side clad layer.

2. The wavelength-tunable DBR laser according to claim 1,
   wherein a bandgap wavelength of the core layer in the DBR region is equal to or greater than 1.0 µm and equal to or less than 1.2 µm, and
   an oscillation wavelength of the wavelength-tunable DBR laser is equal to or greater than 1.27 µm and equal to or less than 1.33 µm.

3. The wavelength-tunable DBR laser according to claim 2, wherein the electron barrier layer and the hole barrier layer are InAlAs-based.

4. The wavelength-tunable DBR laser according to claim 2, wherein the core layer is InGaAsP or InGaAlAs-based.

5. The wavelength-tunable DBR laser according to claim 2, wherein a diffraction grating in the DBR region is a superstructure grating.

6. The wavelength-tunable DBR laser according to claim 1, wherein the electron barrier layer and the hole barrier layer are InAlAs-based.

7. The wavelength-tunable DBR laser according to claim 6, wherein the core layer is InGaAsP or InGaAlAs-based.

8. The wavelength-tunable DBR laser according to claim 6, wherein a diffraction grating in the DBR region is a superstructure grating.

9. The wavelength-tunable DBR laser according to claim 1, wherein the core layer is InGaAsP or InGaAlAs-based.

10. The wavelength-tunable DBR laser according to claim 9, wherein a diffraction grating in the DBR region is a superstructure grating.

11. The wavelength-tunable DBR laser according to claim 1, wherein a diffraction grating in the DBR region is a superstructure grating.

12. The wavelength-tunable DBR laser according to claim 1, further comprising, in the active region, separated confinement heterostructure layers between an active layer and the n-side clad layer and between the active layer and the p-side clad layer.

\* \* \* \* \*